United States Patent [19]
Podolak et al.

[11] Patent Number: 4,763,207
[45] Date of Patent: Aug. 9, 1988

[54] DIGITAL METHOD AND SYSTEM FOR REPRODUCING ANALOG DATA

[75] Inventors: J. B. Podolak, Schaumburg; Douglas R. Adler, Chicago; Ronald B. Saluski, Bolingbrook, all of Ill.

[73] Assignee: R. R. Donnelley & Sons Company, Chicago, Ill.

[21] Appl. No.: 941,205

[22] Filed: Dec. 12, 1986

Related U.S. Application Data

[63] Continuation-in-part of Ser. No. 787,504, Oct. 15, 1985, abandoned.

[51] Int. Cl.$^4$ .......................... G11B 5/09; H03M 1/00
[52] U.S. Cl. ................................. 360/32; 340/347 SH
[58] Field of Search ................... 340/347 SH; 360/32; 358/135; 375/30; 369/59

[56] References Cited

U.S. PATENT DOCUMENTS

| | | | |
|---|---|---|---|
| 3,299,204 | 1/1967 | Cherry et al. | 178/6 |
| 3,324,237 | 6/1967 | Cherry et al. | 178/6 |
| 3,383,461 | 5/1968 | Dryden | 178/6 |
| 3,449,742 | 6/1969 | Stapleton | 340/347 |
| 4,308,585 | 12/1981 | Jordan | 364/520 |
| 4,348,699 | 9/1982 | Tsuchiya et al. | 360/27 |
| 4,370,643 | 1/1983 | Kitamura | 340/347 |
| 4,393,371 | 7/1983 | Morgan-Smith | 340/347 |
| 4,568,912 | 2/1986 | Kitamura et al. | 340/347 |

OTHER PUBLICATIONS

"Compression of Silence in Digitized Speech Recording", by M. A. Patten, IBM TDB, vol. 20, #4, 9/77.

*Primary Examiner*—Vincent P. Canney
*Attorney, Agent, or Firm*—Wood, Dalton, Phillips, Mason & Rowe

[57] ABSTRACT

There is disclosed herein a method of and system for reproducing an analog signal using digital techniques. The system includes means for encoding the analog signal in digital form and means for decoding the encoded analog signal. The encoding means includes means for detecting the upper bandwidth limit of the input analog signal during each of a plurality of successive sample intervals. Means coupled to the detecting means are included for sampling the input analog signal at a sampling rate determined in accordance with the detected upper bandwidth limits to derive a series of voltage levels which together define a sampled approximation of the input analog signal. Means are coupled to the sampling means for converting each voltage level and the sampling rate at which such voltage level was derived into digital signals. Also included are means for detecting when the input analog signal is at substantially a zero level, means for developing a digital indication of the length of time the signal is at such level and means for combining the digital indication with the digital signals to develop a digital representation of the input analog signal. The decoding means includes means for sequentially retrieving the digital signals, means coupled to the retrieving means for converting the digital signals into the sampled approximation of the input analog signal and a low-pass filter coupled to the converting means having a cut-off frequency determined in accordance with the encoded sampling rate for filtering the sampled approximation to reproduce the input analog signal.

77 Claims, 5 Drawing Sheets

DIGITAL METHOD AND SYSTEM FOR REPRODUCING ANALOG DATA

CROSS-REFERENCE TO RELATED APPLICATION

This is a continuation-in-part application of Podolak et al, U.S. application Ser. No. 787,504, filed Oct. 15, 1985, entitled "Digital Method and System for Reproducing Analog Data", assigned to the assignee of the instant application, now abandoned.

TECHNICAL FIELD

The present invention relates generally to encoding and decoding techniques, and more particularly to a method and system for encoding analog data or signals in digital form and reproducing the analog data or signals therefrom.

BACKGROUND ART

Prior systems and techniques for digitally encoding and decoding analog data or signals have been developed in the field of audio signal reproduction. Typically, such systems are based upon the Nyquist theorem which states that an analog bandwidth-limited signal can be reproduced exactly by sampling the signal at a rate at least twice the upper bandwidth limit of the signal to create a staircase approximation of the signal and by passing the staircase approximation through an ideal low-pass filter having a cut-off frequency equal to the upper bandwidth limit. In accordance with this theorem, prior systems have sampled the analog signal at a constant rate which is at least twice the highest anticipated frequency of the signal. For speech, the upper frequency limit is approximately 4 kilohertz while the upper frequency limit of music is considered to be the maximum frequency that can be detected by the human ear, i.e. 20 kilohertz. Accordingly, prior systems have used a sampling frequency of 44.1 kilohertz to encode musical signals.

The sampled analog signal is then converted into a series of digital signals which are stored on a storage medium, such as an audio compact disc.

During the reproduction process, the digital signals are sequentially retrieved from the storage medium at a constant rate, converted back to analog signals by a digital-to-analog converter and passed through a low-pass filter having a constant cut-off frequency equal to the highest anticipated frequency of the audio signal. In this manner, the analog signal is reconstructed without substantial distortion and loss.

While this type of encoding/decoding process results in highly accurate reproduction of the audio signal, it has been found that this process requires a large amount of digital signals to encode even a small portion of the audio signal. As a result, currently available compact discs are capable of recording only a limited amount (60–90 minutes) of stereo music.

Other systems have been devised which sample the analog signal at a variable rate wherein the rate is determined in dependence upon the magnitude of change of the amplitude of the analog signal. Such types of amplitude-dependent variable rate sampling, however, results in excessive oversampling of high-amplitude, low-frequency audio, music or voice signals. Such types of systems, therefore, also require a large amount of digital signals to encode such signals. Systems of this type are disclosed in Cherry et al U.S. Pat. No. 3,299,204, Stapleton U.S. Pat. No. 3,449,742, Jordan U.S. Pat. No. 4,308,585 and Kitamura U.S. Pat. No. 4,370,643.

A still different type of system for reproducing an analog signal is disclosed in Tsuchiya et al U.S. Pat. No. 4,348,699. This system includes means for establishing a sampling frequency at which an entire selected analog signal is sampled to create a digital signal and means for generating an encoded representation of the sampling frequency, which representation is recorded on a recording medium along with the digitally encoded analog signal. The representation of the sampling frequency is used to control the transport speed of the recording medium so that the system records the digital signals at a predetermined constant density on the recording medium. It does not appear, however, that this system results in a reduced or minimum amount of digital signals to encode an analog signal.

Kitamura et al U.S. Pat. No. 4,568,912 discloses a data compression system wherein a series of words which represent an analog signal at equally spaced intervals throughout the signal are converted into a second series of digital words which represent the analog signal at intervals between zero crossing points thereof. The intervals defined by the second series of words are equally spaced between successive zero crossing points of the analog signal but the interval duration in one portion of the signal between zero crossing points may be different than the duration of the intervals in another portion of the analog signal between two other zero crossing points.

The second series of words are analyzed to produce a straight line approximation of the analog signal and the approximation is filtered by a variable frequency low-pass filter to reconstruct the analog signal.

However, the Kitamura et al system does not attempt to reproduce high frequency components of an analog signal. Rather, it appears that the time between successive zero crossing points is detected and the rate at which the analog signal is sampled is determined in accordance with the detected time. Moreover, this system deliberately filters high frequency components from the original analog signal so that memory savings are achieved.

Also, it appears that the variable frequency low-pass filter described in the Kitamura et al patent is inherently slow in response time and hence could not reproduce high frequencies.

SUMMARY OF THE INVENTION

In accordance with the present invention, a digital method and system for reproducing analog data accomplishes a significant reduction in the amount of digital signals required to reproduce a given analog signal.

The present invention comprises a method and apparatus for encoding an analog input signal in digital form as a sequence of digital signals and a method and apparatus for decoding the digital signals to reproduce the analog input signal. The apparatus for encoding the analog signal in digital form comprises means for detecting the upper bandwidth limit of the analog input signal. Means are coupled to the detecting means for sampling the analog input signal at a variable sampling rate determined in accordance with the detected upper bandwidth limit to derive a series of voltage levels which together define a sampled approximation of the input analog signal. Means coupled to the sampling means convert each voltage level and the sampling rate at which such voltage level was derived into a digital signal or word to develop a digital representation of the analog input signal.

The apparatus for decoding the digital representation includes means for sequentially retrieving the digital signals, means coupled to the retrieving means for converting the digital signals into the sampled approximation of the analog input signals and a filter coupled to the converting means having a cut-off frequency determined in accordance with the encoded sampling rate for filtering the sampled approximation to reproduce the analog input signal.

In the preferred embodiment, means are provided in the encoding portion of the system to detect when the analog input signal is at substantially a zero level. When such a condition is detected, a counter measures the length of time the input analog signal is at such level and a represetation of the length of time is encoded in digital form. This digital representation is then utilized in the decoding section to inhibit the output of the filter to ensure that a substantially zero level of correct duration is reproduced in the output signal. This technique further decreases the amount of digital signals required to reproduce an analog signal of given length since only one or a few digital signals representing the length of the substantially zero level condition are required rather than a plurality of digital signals representing the substantially zero level condition for each of a plurality of increments of time.

The reduction in the amount of digital signals representing a given analog signal results in a substantial increase in the storage capacity of various storage media in the event the analog signal is to be reproduced from data stored thereon.

The encoding/decoding technique and system disclosed herein may also be useful in those situations when it is desired to transmit analog data by digital techniques over a transmission medium. In such a case, the analog data may be converted to the data of the format described above and transmitted directly to a remote location or stored first and then transmitted to achieve a savings in transmission time.

DESCRIPTION OF THE PREFERRED EMBODIMENT

Figure 1:
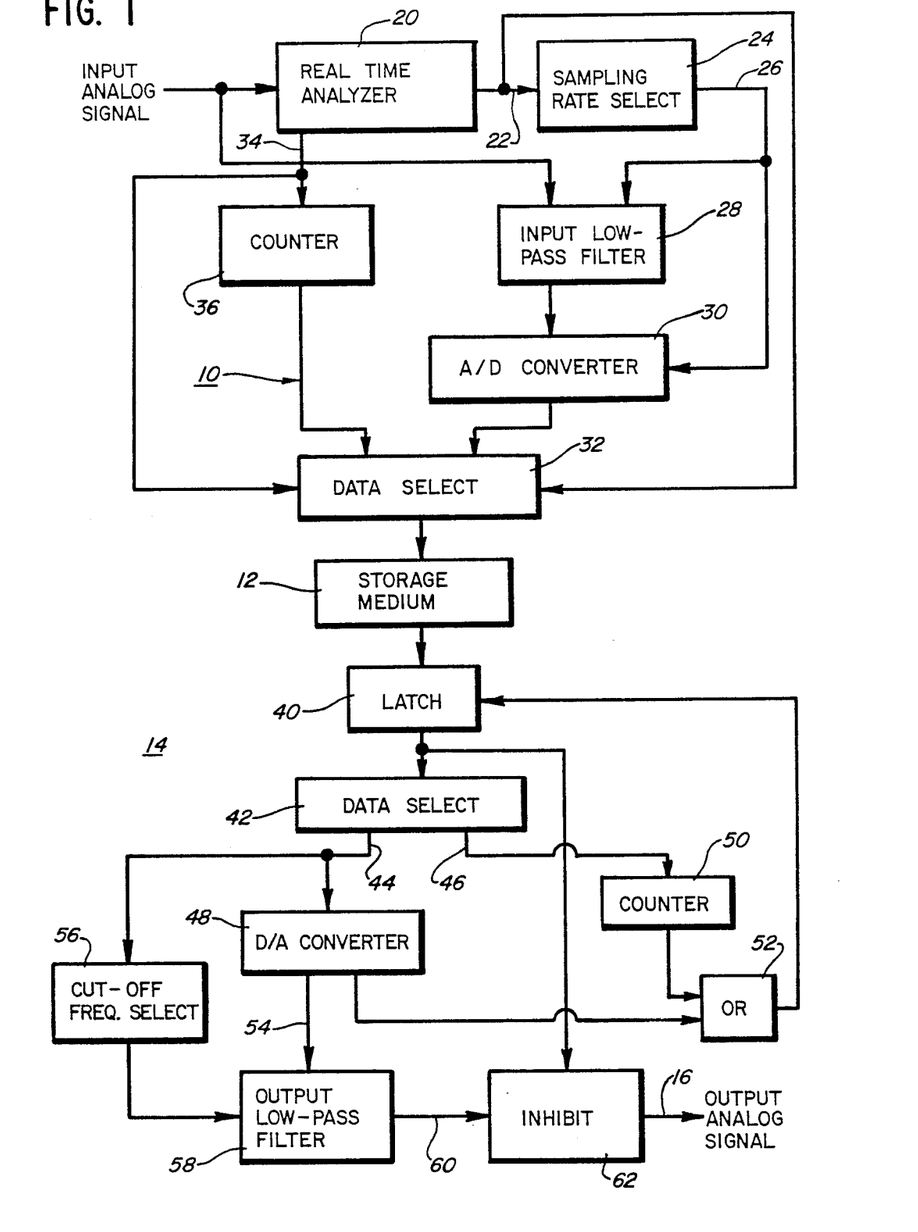
FIG. 1 is a simplified block diagram of a combined digital encoding and decoding system for reproducing analog data.

Referring now to FIG. 1, there is illustrated a generalized block diagram of the system according to the present invention. The system includes an encoding section 10 which encodes an input analog signal, such as an audio signal, in digital form and stores the digital signals representing the input signal on a storage medium 12. A second or decoding section 14 coupled to the encoding section 10 via the storage medium 12 retrieves the digital signals therefrom and recreates the input analog signal at an output 16.

The encoding section 10 includes a bandwidth detector 20 in the form of a real time analyzer which is described in greater detail hereinafter. The real time analyzer 20 develops a bandwidth code output on a series of lines 22 which represents the upper limit of the bandwidth of the input analog signal. The lines 22 are coupled to a sampling rate selection circuit 24 which develops one of a plurality of sampling rate outputs on a line 26.

The input analog signal is also coupled to an input low-pass filter 28 which has a variable cut-off frequency as determined by the output of the sampling rate selection circuit 24. In effect, the input low-pass filter 28 attenuates signal components at frequencies above the upper bandwidth limit as detected by the real time analyzer 20.

The input low-pass filter 28 prevents harmonics of short duration which may have escaped detection by the real time analyzer 20 from causing aliasing effects in the reproduced signal. In the preferred embodiment and as noted more specifically below, the input low-pass filter 28 also samples the input analog signal at a variable sampling rate determined by the output of the sampling rate selection circuit 24 to develop a sampled or multi-level staircase approximation of the analog input signal.

The output of the input low-pass filter 28 is coupled to an analog-to-digital (A/D) converter 30 which converts the multi-level staircase approximation into a series of digital words which are coupled to a data select circuit or data switch 32.

The real time analyzer 20 includes a further output on a line 34 which is in a high state when the input analog signal is at substantially a zero level. A high state signal on the line 34 enables a counter 36 having a digital output which is coupled to the data select circuit 32. Further, during this time the bandwidth code output on the lines 22 assumes a value indicating that the input analog signal is at the substantially zero value.

If the level of the signal on the line 34 is in the high state indicating that the input analog signal is at substantially the zero level, the output of the counter 36 together with the bandwidth code on the lines 22 are stored as a digital word at a storage location on the storage medium 12. On the other hand, if the level of the signal on the line 34 is low, the output of the A/D converter 30 together with the bandwidth code on the lines 22 are stored as a digital word in the storage position on the storage medium 12.

It should be noted that the storage medium 12 may be any device capable of storing digital information. For example, the storage medium 12 may be a compact audio disc, a laser disc commonly used in video reproduction, a hard disk typically used in computers, magnetic tape or disks, or the like. In each case, an appropriate encoding or writing device must be used between the data select circuit 32 and the storage medium 12 to permit storing of the information on the medium 12.

As noted previously, the storage medium 12 is not necessary in the event the data is to be transmitted to a remote location. In such a case, a buffer, however, may be required.

The decoding section 14 includes a latch 40 which sequentially retrieves the stored digital words from the storage medium 12. Of course, appropriate reading or decoding apparatus must be used between the storage medium 12 and the latch 40 to obtain the digital words from the storage medium 12.

Coupled to the latch 40 is a second data select circuit or data switch 42 which includes first and second outputs on lines 44,46. The first output 44 is coupled to a digital-to-analog (D/A) converter 48. The second output 46 is coupled to a counter 50 and thence to an OR gate 52 which receives a second input from an output of the D/A converter 48.

The data select circuit 42 analyzes the bandwith code retrieved from the storage medium 12 to determine whether the analog signal to be reproduced is at substantially the zero level and, if this is the case, the data word retrieved from the storage medium 12 is passed to the counter 50. The counter 50 comprises a programmable countdown counter which produces a high state output when the counter 50 counts down to zero. This high state output is coupled through the OR gate 52 back to the latch 40 to retrieve or fetch the next digital word from the storage medium 12.

On the other hand, if the bandwidth code retrieved from the storage medium 12 indicates that the signal to be reproduced is not at substantially the zero level, the data select circuit 42 passes the retrieved data to the D/A converter 48 which develops an analog output level at an output 54 that is maintained by the D/A converter 48 for a time determined by the bandwidth code. This code also represents the sampling frequency at which the digital word was originally created and stored on the medium 12.

When the analog output level from the D/A converter on the line 54 has been maintained for the required time, a high state signal is coupled to the OR gate 52 which causes the latch 40 to retrieve the next data word. The D/A converter 48 thereby reconstructs or reproduces the staircase approximation of the input analog signal.

The output 44 of the data select circuit 42 is also coupled to a cut-off frequency selection circuit 56 having an output connected to one input of an output low-pass filter 58. A second input of the output low-pass filter 58 is coupled to the line 54 and thereby receives the reconstructed staircase approximation of the input analog signal at the output of the D/A converter 48. The output low-pass filter 58 filters the staircase or sampled approximation of the input analog signal to recreate the input analog signal on a line 60.

An inhibit circuit 62 is coupled to the line 60 and inhibits the output of the low-pass filter 58 when the data retrieved from the storage medium 12 indicates that an analog signal of substantially zero level is to be reproduced. The inhibit circuit 62 prevents unwanted noise from being introduced on the output line 16.

On the other hand, if the data retrieved from the storage medium 12 indicates that an analog signal not at substantially the zero level is to be reproduced, the inhibit circuit 62 is inoperative and allows the signal on the line 60 to pass to the output line 16.

Figure 2A:
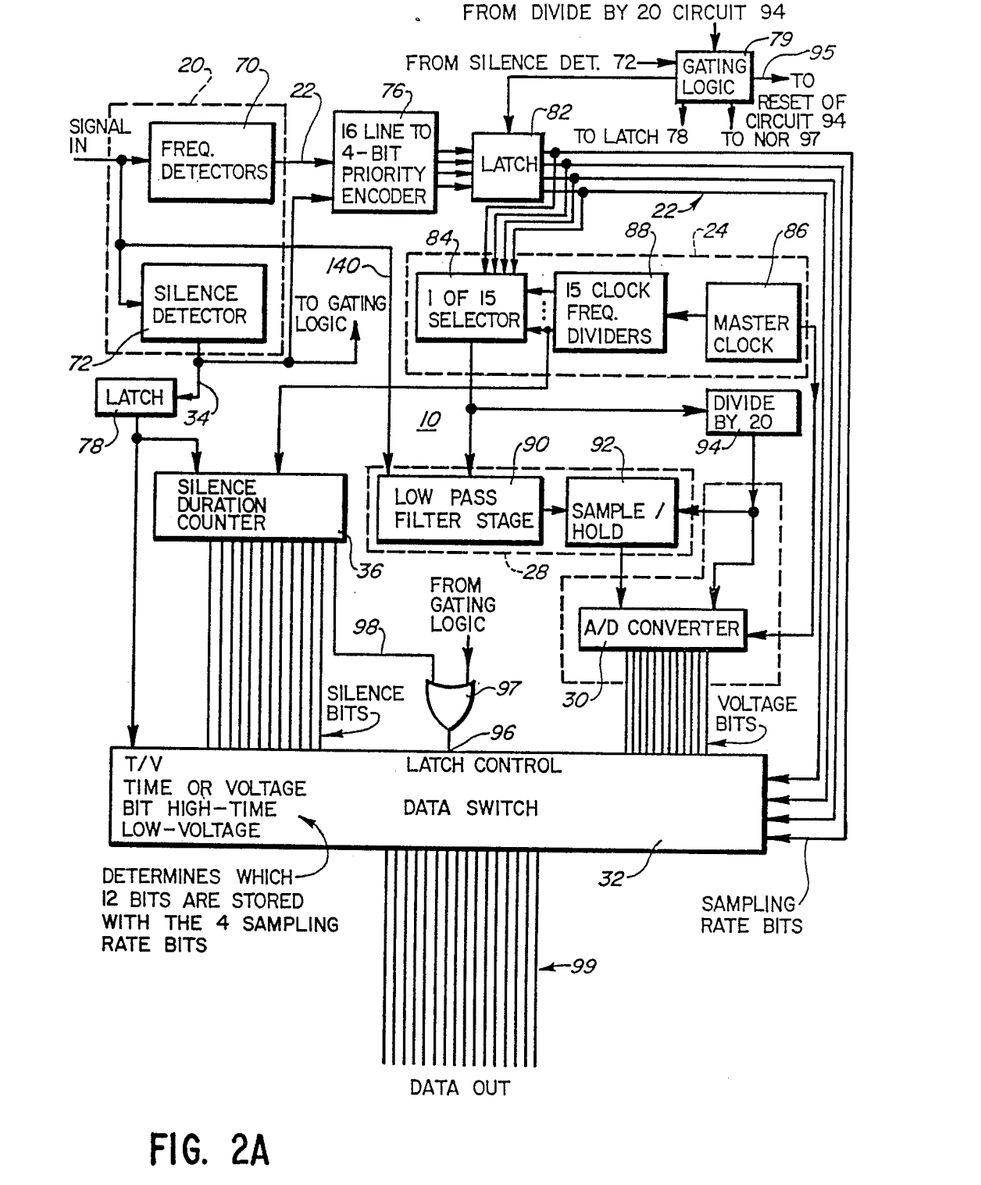
FIGS. 2A and 2B are more detailed block diagrams of the system shown in FIG. 1.
Figure 3:
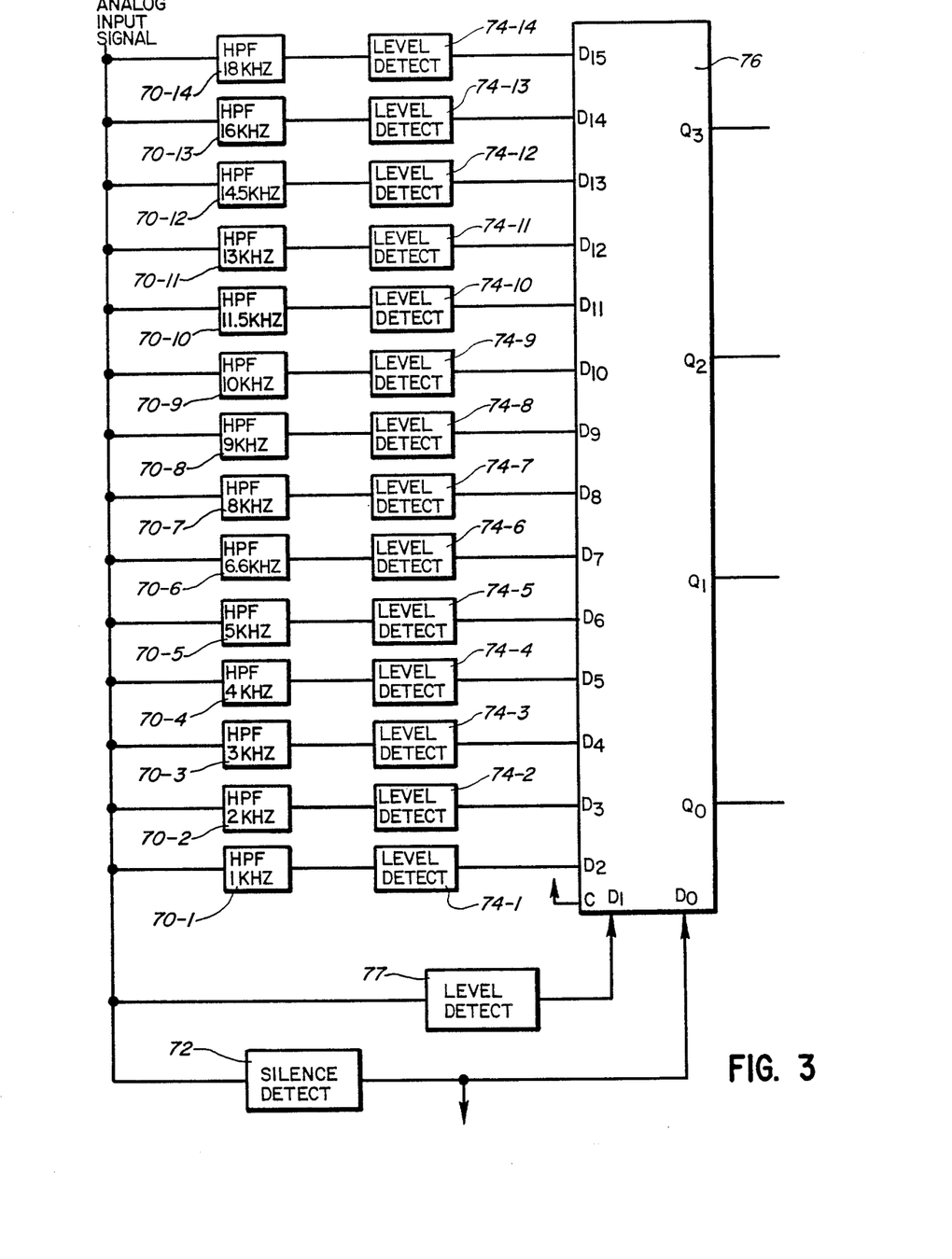
FIG. 3 is a block diagram of the real time analyzer shown in block diagram form in FIGS. 1 and 2A.

Referring now to FIGS. 2A and 3, there is illustrated in greater detail the encoding section 10 illustrated in FIG. 1.

The real time analyzer 20 includes a series of frequency detectors 70 which, as seen in FIG. 3, are fourteen in number together with a silence detector 72. It should be noted that the silence detector may be separate from the real time analyzer 20 is desired.

As seen specifically in FIG. 3, each frequency detector 70-1 through 70-14 comprises a high-pass filter which receives the input analog signal. The high-pass filters 70-1 through 70-14 have different cut-off frequencies which, in the preferred embodiment, are equal to 1 kilohertz, 2 kilohertz, 3 kilohertz, 4 kilohertz, 5 kilohertz, 6.6 kilohertz, 8 kilohertz, 9 kilohertz, 10 kilohertz, 11.5 kilohertz, 13 kilohertz, 14.5 kilohertz, 16 kilohertz and 18 kilohertz. Of course, other cut-off frequencies may be used, if desired. The high-pass filters 70-1 through 70-14 are connected to level detectors 74-1 through 74-14, respectively. The level detectors 74 are in turn coupled to fourteen inputs of a priority encoder 76 also shown in FIG. 2A.

Each high-pass filter 70 attenuates frequency components in the analog input signal below the cut-off frequency and passes the filtered signal to an associated level detector 74. The level detector compares the filtered signal against a predetermined reference and, if the amplitude of the filtered signal is greater than the predetermined reference, a high state signal is developed at the output of the level detector 74.

On the other hand, if the amplitude of the filtered signal is less than the predetermined reference, a low state signal is developed at the output of the level detector 74.

Each level detector 74 latches a high state signal at its output for a predetermined period of time which, in the preferred embodiment, is on the order of one-third second. Each level detector 74, however, does not latch a low state signal at its output and therefore immediately generates a high state signal when the predetermined reference is exceeded, which signal, as just noted, is thereafter latched for the one-third second interval. This means that the output of the real time analyzer 20 can instantaneously respond to an increase in bandwidth, but will maintain an indication of a high bandwidth for approximately one-third second after the actual bandwidth has decreased from the high value. This prevents excessive changes in sampling rate, as noted more specifically below.

The predetermined reference against which the filtered signals are compared is determined in dependence upon the anticipated range of amplitudes of the input signal and the rate of roll-off of the filters 70. In the preferred embodiment, the high-pass filters are fourth order filters or higher and the predetermined reference level against which the filtered signals are compared by the level detector 74 is in the range of 2 millivolts above ground potential when the maximum peak-to-peak input signal amplitude is equal to 10 volts, or alternatively, 0.02% of the total signal amplitude.

The priority encoder 76 includes sixteen inputs $D_0$–$D_{15}$. The level detectors 74-1 through 74-14 are coupled to the inputs $D_2$–$D_{15}$, respectively. The input $D_1$ receives the output of a further level detector 77 which in turn receives the analog input signal. The input $D_0$ receives the output of the silence detector 72.

The priority encoder 75 includes four outputs $Q_0$–$Q_3$ which together comprise four-bit binary output described in greater detail hereinafter.

The outputs of the level detectors 74-1 through 74-14 and 77 together comprise a fifteen bit word representing the upper bandwidth limit of the input analog signal. For example, when the input analog signal contains a frequency component above 18 kilohertz having an amplitude greater than the reference level, each of the outputs of the level detector 74 is in a high state to form the binary word 111111111111111. This fifteen bit binary word, together with the signal from the silence detector 72 on the input $D_0$ is converted to a unique four-bit output 1111 at the outputs $Q_0$–$Q_3$.

When the analog input signal contains frequency components greater than 16 kilohertz but less than 18 kilohertz, the fifteen bit word coupled to the inputs $D_1$–$D_{15}$ is 011111111111111. This code, in conjunction with the high signal on the input $D_0$ causes the outputs $Q_0$–$Q_3$ to generate a unique four-bit output 1110.

Other fifteen bit words are created in like fashion representing the upper bandwidth limit of the input audio signal. When the input audio signal is above a reference level for the detector 77 and contains frequency components which do not exceed 1 kilohertz, each of the level detectors 74 generates a low state output while the level detector 77 generates a high state output. These outputs, together with the signal at the inputs $D_0$ generate the word 0001 at the output of the priority encoder 76.

Referring again to FIG. 2A, when the amplitude of the analog input signal drops below a reference level for the silence detector 72, a high state output or digital silence signal is generated thereby which is coupled to the input $D_0$ of the priority encoder 76 which then develops a four-bit word 0000. The digital silence signal is also coupled via an edge-triggered latch 78 to an enable input of the counter 36. The latch 78 is further connected to a control input of the data select circuit or data switch 32. The latch 78 comprises means for generating the time/voltage data bit noted above.

The latch 78 is controlled by a gating logic circuit 79 which is described in greater detail hereinafter in connection with FIG. 4. The output of the latch 78, when in the high-state indicating that the input analog signal is at substantially the zero level, causes the count 36 to develop one or more 12 bit digital output words, also referred to as a digital silence duration signal, representing the accumulation of 2500 kilohertz clock pulses developed by a set of dividers described in greater detail below. The 12 bit output of the counter 36 is coupled to the data switch 32 and represents the length of time that the analog signal is at substantially the zero level.

The output of the priority encoders 76 is coupled to a four-bit edge-triggered latch 82 which is in turn coupled to a one-of-fifteen selector circuit 84 in the sampling rate select circuit 24. The latch 82 is controlled by the gating logic circuit 79 as noted more specifically below. At this point, it suffices to say that the latch 82 is periodically triggered to provide at its output the four-bit output word appearing at the output of the priority encoder 76 at the time the latch 82 is triggered. The latch 82 maintains this four-bit word at its output until it is triggered again. The latch 82 therefore defines sampling intervals of equal length until a different four-bit words is latched at its output.

The one-of-fifteen selector passes one of fifteen clock signals developed by a clock 86 and a plurality of dividers 88 to a low-pass filter stage 90 in the input lowpass filter 28. One of the dividers 88 supplies the 2.5 kilohertz clock signal to the silence duration counter 36 as noted above. The low-pass filter stage 90 also receives the input analog signal and filters same with a cut-off frequency established by the output of the one-of-fifteen selector 84 so that signal components at frequencies greater than a predetermined fraction (at most one-half per the Nyquist theorem) of the sampling rate are removed from the analog signal before sampling.

The input low-pass filter 28 also includes a sample and hold function, represented by the block 92 which develops an output that, as previously mentioned, is a sampled or staircase approximation of the input analog signal. The staircase approximation comprises a plurality of signal levels, the duration of each of which is equal to the corresponding sampling interval or subdivision of the input analog signal. The duration of each of the signal levels may be the same as or different than the duration of other signal levels. Each signal level duration, or equivalently the duration of each sampling interval, is determined by the sampling rate which is in turn selected in accordance with the upper bandwidth limit of the input analog signal as detected by the frequency detector 70 and as selected by the encoder 76 and the latch 82. In general, one of a plurality of sampling rates is chosen to determine a sampling interval in dependence upon the upper bandwidth limit detected in the preceding sampling interval. In the preferred embodiment, the lowest sampling rate that exceeds a particular multiple (at least two per the Nyquist theorem) of the detected upper bandwidth limit is selected. More specifically, the sampling rate for each sampling interval in the preferred embodiment is selected to be equal to:

$$f_s = 2.5 \times f_{BW}$$

where $f_s$ is the sampling rate and $f_{BW}$=one of $f_0$–$f_{14}$ as determined by the following:

$f_{BW}=f_0$ if $f_n<f_0$ where $f_n$ is the highest frequency of the input signal represented by the four-bit output of the latch 82 as detected in the immediately preceding sampling interval
$f_{BW}=f_1$ if $f_0\leq f_n<f_1$
$f_{BW}=f_2$ if $f_1\leq f_n<f_2$
$f_{BW}=f_3$ if $f_2\leq f_n<f_3$
$f_{BW}=f_4$ if $f_3\leq f_n<f_4$
$f_{BW}=f_5$ if $f_4\leq f_n<f_5$
$f_{BW}=f_6$ if $f_5\leq f_n<f_6$
$f_{BW}=f_7$ if $f_6\leq f_n<f_7$
$f_{BW}=f_8$ if $f_7\leq f_n<f_8$
$f_{BW}=f_9$ if $f_8\leq f_n<f_9$
$f_{BW}=f_{10}$ if $f_9\leq f_n<f_{10}$
$f_{BW}=f_{11}$ if $f_{10}\leq f_n<f_{11}$
$f_{BW}=f_{12}$ if $f_{11}\leq f_n<f_{12}$
$f_{BW}=f_{13}$ if $f_{12}\leq f_n<f_{13}$
$f_{BW}=f_{14}$ if $f_{13}\leq f_n$ In the preferred embodiment, the following values are used for $f_0$–$f_{14}$:

$f_0=1$ khz
$f_1=2$ khz
$f_2=3$ khz
$f_3=4$ khz
$f_4=5$ khz
$f_5=6.6$ khz
$f_6=8$ khz
$f_7=9$ khz
$f_8=10$ khz
$f_9=11.5$ khz
$f_{10}=13$ khz
$f_{11}=14.5$ khz
$f_{12}=16$ khz
$f_{13}=18$ khz
$f_{14}=20$ khz As previously noted, the input low-pass filter 28 not only accomplishes the low-pass filtering that minimizes the incidence of aliasing, but also includes the sample and hold function for generating the staircase approximation of the analog input signal. The input low-pass filter 28 is implemented in the preferred embodiment by an MF10 dual-switched capacitor filter chip manufactured by National Semiconductor. It should be noted, however, that the elements 90,92 may be separate circuits implemented by other chips or components, if desired.

The staircase approximation of the analog input signal is coupled to the A/D converter 30 which receives a timing input or a sample clock signal from a divide-by-20 circuit 94 coupled to the output of the one-of-fifteen selector 84. The A/D converter converts the staircase approximation of the audio signal into a series of 12 bit digital words representing each analog level or segment of the staircase approximation. These twelve bits are combined with the four-bit output of the latch 82 by the data switch 32 to generate a plurality of digital signals or words representing each voltage level together with the sampling rate during each interval thereof.

The sample clock signal from the divide-by-20 circuit 94 is also coupled to the sample and hold block 92 to control same and to one input of the gating logic circuit 79 which selects the duration of each sampling interval by controlling the latch 82, as described in greater detail in connection with FIG. 4. The gating logic circuit 79 includes a second input coupled to the output of the silence detector 72. When the output of the silence detector 72 is low, the latch 82 is triggered by the gating logic circuit 79 at the rising edge of each pulse of the sample clock signal from the divide-by-20 circuit 94. On the other hand, if the output of the silence detector 72 is in a high state, the gating logic circuit 79 prevents further triggering of the latch 82 until the output of the silence detector 72 returns to the low state. Also, the circuit 79 triggers the latch 78 at the next rising edge of the sample clock signal from the divide-by-20 circuit 94 to start the counter 36 and to provide a high state time/voltage data bit to the data switch 32.

The data switch 32 includes a latch control input 96 which is coupled to the output of an OR gate 97. The OR gate 97 includes first and second inputs coupled to an overflow output line 98 of the twelve bit time counter 36 and an output of the gating logic circuit 79, respectively.

The data switch 32 selects the 16 bits comprising the 12 bit output of the counter 36 and the 4 bit output of the latch 82 or the 16 bits comprising the 12 bits from the A/D converter 30 and the four bits from the latch 82 to derive a series of digital words or signals which are stored on the storage medium. That is, the data switch 32 latches one of the 16 bit words at a series of data output lines 99 when a rising edge of a signal from the OR gate 97 is received at the latch control input 96. The OR gate 97 in turn generates a low to high transition when: (a) the twelve bit time counter 36 becomes full, at which point a high state signal is developed on the overflow output lines 98; (b) at the end of a period of silence, as detected by the silence detector 72, at which point the output thereof drops to a low level in turn causing the gating logic circuit 79 to develop a pulse; or (c) at the end of a sampling interval at which time the gating logic circuit 79 develops a pulse.

In summary, therefore, a series of 16 bit digital words or signals are stored on the storage medium representing either: (a) the voltage level and sampling rate of the analog input signal or (b) an indication that the analog input signal is at substantially the zero level and the duration thereof. In the latter case, the indication that the analog signal is at the substantially zero level comprises a zero in each of the four most significant bit positions of the digital word.

Figure 4:
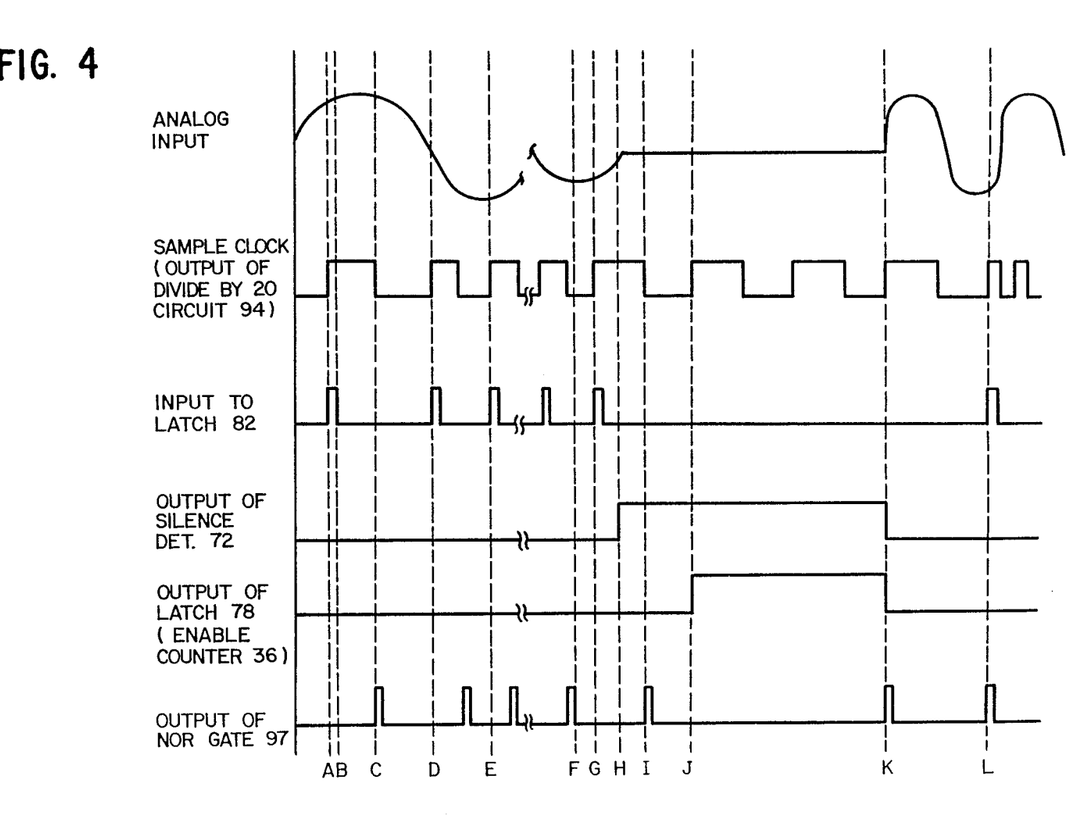
FIG. 4 is a waveform diagram illustrating the operation of the system shown in FIG. 2A.

Referring now to FIG. 4, there is illustrated a waveform diagram illustrating in greater detail the timing of the circuitry shown in block diagram form in FIG. 2A. The timing illustrated in FIG. 4 is accomplished by means of the gating logic circuit 79 shown in FIG. 2A. The gating logic circuit 79 includes discrete or integrated logic components which are coupled to the outputs of the divide-by-20 circuit 94 and the silence detector 72 to accomplish the required triggering of the latches 78 and 82 and to control the operation of the OR gate 97. Furthermore, the gating logic circuit 79 resets the divide-by-20 circuit 94 at an appropriate time, as noted more specifically below.

Referring specifically to FIG. 4, at a time A a first sampling interval begins at which time the output of the divide-by-20 circuit 94 switches between a low and a high state. At this time, the analog input signal is not at substantially the zero level. The gating logic circuit 79 develops a pulse at the time A to trigger the latch 82 so that the four bit word from the priority encoder 76 is provided to the one of fifteen selector 84 and to the data switch 32, as previously noted.

At a time B, the A/D converter 30 converts the sampled and held output of the low pass filter 28 to a digital signal and provides the digitized signal to the data switch 32.

At a time C, the output of the divide-by-20 circuit 94 drops to a low level, in turn causing the gating logic circuit 79 to redundantly reset the twelve bit time counter 36. Also, a pulse is coupled to the OR gate 97 to cause the output of the A/D converter 30 to be latched on the lines 99.

At a time D, the first sampling interval ends and a second sampling interval begins. At this time an increased samle rate is developed at the output of the divide-by-20 circuit 94. This increased sample rate $f_s$ is developed in response to an increase in the upper bandwidth limit detected during the first sampling interval between points A and D. As before, at the rising edge of each pulse from the sample clock subsequent to the time D, a pulse is developed which is coupled to the latch 82 to trigger same so that the output of the four bit priority encoder is coupled to the input of the one-of-fifteen selector 84. During this time, it is assumed that the frequency of the analog input signal does not increase and therefore, the sampling rate is maintained at a constant value.

At a time E the second sampling interval ends. Also, the frequency of the analog input signal drops below that detected immediately prior to the time D. Since the level detectors 74 hold their high state outputs for one-third second, at least this period of time must pass before the sampling rate is adjusted to a lower level. This one-third second interval means that for one-third second following the time E, the analog input signal is oversampled, i.e. sampled at a rate greater than that necessary to properly encode the signal. This one-third second interval is not shown in the waveforms of FIG. 4 since to do so would require an inordinate amount of space on the drawing.

Assume that at a time F the one-third second interval from the time E has elapsed. Therefore, at the next rising edge of the signal from the divide-by-20 circuit 94 at time G, the sampling rate can drop down to a lower level which is the minimum level necessary to encode this segment of the analog input signal.

At the time H subsequent to the time G the analog input signal drops to a substantially zero level. At this time the output of the silence detector 72 switches between a low and a high state. Upon receipt of the next falling edge of the output of the divide-by-20 circuit 94 by the gating logic circuit 79, a pulse is developed by the circuit 79 to cause the data switch 32 to latch the output of the A/D converter 30.

At a time J the next rising edge of the output from the divide-by-20 circuit 94 is developed. At this time, the counter 36 is enabled by the gating logic circuit 79 via the latch 78 to begin timing the silence period. During this period of silence, the sampling clock at the output of the divide-by-20 circuit 94 remains at the same frequency so that the sample rate is "remembered". Also during this time, the OR gate 97 does not trigger the latch control input 96 of the data switch 32 unless the counter 36 overflows, in which case a high state signal is developed in the overflow output line 98. In the example shown in FIG. 4, however, it is assumed that this does not occur and hence no latch pulses are developed by the OR gate 97 during the silence period.

Assume that at time K the silence period ends, at which time the output of the silence detector 72 drops to a low state as does the output of the latch 78. This disables further accumulation of pulses by the counter 36. Further, at this time a high state signal is provided by the gating logic circuit 79 to the OR gate 97 to cause the output of the counter 36 to be latched by the data switch 32.

Also at time K the gating logic circuit 79 resets the divide-by-20 circuit 94 via a line 95 so that a new sampling interval is initiated by a rising edge of a pulse from the circuit 94. The frequency of the signal from the divide-by-20 circuit 94, however, is the same as that which was produced prior to the detection of silence, i.e. prior to the time I. This is the case even if the analog input signal frequency is in excess of one-half the sampling rate. Prior to the next rising edge of the sample clock at a time L this increased frequency is detected. A new increased sampling rate is developed by the divide-by-20 circuit 94 at the time L so that this portion of the analog input signal can be encoded.

It should be noted that the sampling rate or the duration of each sampling interval is determined in accordance with the detected upper bandwidth limit in a previous sampling interval. That is, the detected upper bandwidth limit during one interval determines the sampling rate or the duration of the next sampling interval. This is due to the fact that the real time analyzer 20 requires a finite time to determine the upper bandwidth limit. This may result in the introduction of distortion or losses in the reproduction process since the upper bandwidth limit may increase from interval to interval. In order to overcome this problem, a delay line, such as that indicated by the reference numeral 140 in FIG. 2A, may be coupled to the input of the low pass filter stage 90 so that a delayed version of the analog input signal is provided at such input. If the time constant of the delay line is selected to be slightly greater than one period of the lowest sampling rate, then the low pass filter 28 can sample the delayed version of the analog input signal during intervals thereof at sampling rates detected during corresponding intervals of the undelayed version of the analog input signal. In other words, the sampling rate for each interval can be correlated with the detected upper bandwidth limit for that interval so that exact reproduction can be accomplished.

Also, the present invention need not use fifteen sampling rates but may instead use a different number of sampling rates, if desired. In fact, the sampling rate can be made continuously variable to provide a further increase in memory saving. Also, a greater or lesser number of bits may be used to specify the voltage levels and/or the duration of a substantially zero level, depending upon the accuracy desired.

Further, it should be noted that the one-third second holding function accomplished by the level detectors 74 in the real time analyzer 20 may result in the sampling rate which is in excess of that required to adequately encode a portion of the analog input signal. This, however, does not significantly increase memory usage and prevents excessive rates of change of sampling rate which could cause audible distortion in the reproduced signal.

Figure 2B:
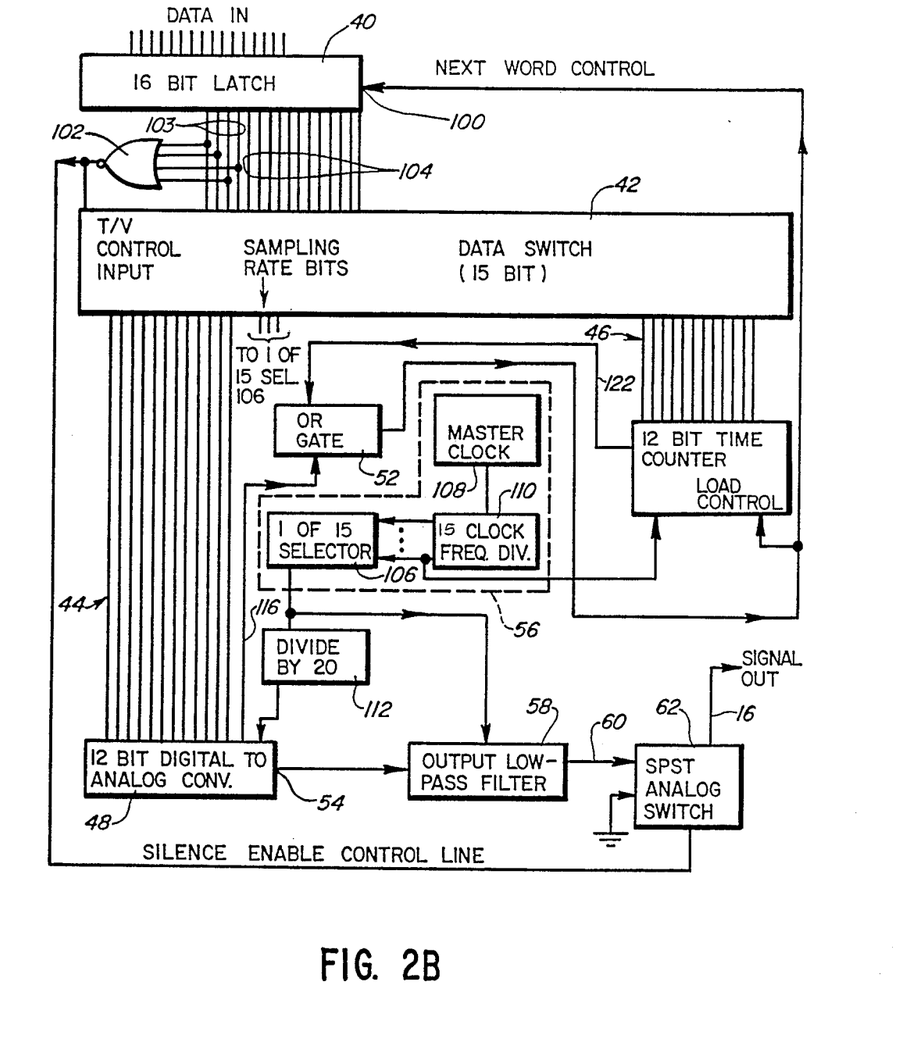

Referring now to FIG. 2B, the data words stored on the storage medium are sequentially retrieved by means of the latch 40, which latches the 16 bits of data until a signal is received at a control input 100. A NOR gate 102 receives the sampling rate bits on a series of lines 103. If the data word stored in the latch 40 represents a voltage level and the sampling rate for that level as denoted by a one in at least one of the four sampling rate bits, the state of a signal at the output of the NOR gate 102 is low, in turn causing the remaining 12 bits on a series of lines 104 to be passed over lines 44 to the D/A converter 48. The four sampling bits are coupled to a one-of-fifteen selector circuit 106 in the cut-off frequency selector 56.

The one-of-fifteen selector 106, which is similar to the selector 84, passes one of fifteen clock signals developed by a master clock 108 and a series of fifteen frequency dividers 110 to a divide-by-20 circuit 112 and to the output low-pass filter 58. The D/A converter 48 converts the 12 bits of information into the appropriate voltage level at the output 54 and latches the output at this voltage level for a period of time determined by the output of the divide-by-20 circuit 112. Once the appropriate time period for latching of this voltage level has elapsed, a high state signal is developed at an output 116 of the D/A converter, in turn causing the OR gate 52 to develop a high state signal. This high state signal is coupled to the control input 100 of the 16 bit latch 40 to fetch the next data word.

The D/A converter 48 thereby reconstructs the sampled or staircase approximation of the analog input signal at the output 54. The staircase approximation is filtered by the output low-pass filter 58 which has a variable cutoff frequency corresponding to the frequency $f_{BW}$ which was originally used to sample and therefore encode each signal segment. In accordance with the Nyquist theorem, the output low-pass filter 58 reproduces the analog input signal at the output 60. The output 60 is in turn coupled to the inhibit circuit 62, which in the preferred embodiment comprises a single-pole single-throw analog switch.

In the event that the latch 40 has latched a data word indicating that the analog signal to be reproduced is at substantially the zero level, a high state signal is developed by the NOR gate 102 which in turn causes the analog switch to disconnect the output line 16 from the line 60. This ensures that no noise is introduced in the reproduced signal.

Also, when the output of the NOR gate 102 is in the high state, the 12 bits of information on the lines 104 from the data word are passed to the counter 50 over the lines 46. In operation, the counter 50 is loaded with the data word and counts down from this value at a rate determined by a 2500 kilohertz clock signal from the dividers 110. Once the counter is decremented to zero, a high state signal is developed on a line 122 which is coupled to the OR gate 52. This in turn causes the OR gate 52 to signal the latch 40 to fetch the next data word.

It should be noted that the input and/or output low pass filters 28,58 may introduce phase delays which are variable in dependence upon the frequency of the signal being reproduced and/or the cut-off frequency of the filter. This may in turn give rise to undesirable distortion in the reproduced signal. This distortion may be reduced or substantially eliminated by utilizing filters which eliminate the signal frequency-sensitive or cut-off frequency-sensitive phase delay.

The present invention finds particular utility in the reproduction of audio signals, although it should not be considered to be so limited. In fact, this encoding technique can be used to increase the efficiency of digital communications or other digital processes.

We claim:

1. A method of encoding an analog signal in digital form, comprising the steps of:
   (a) analyzing the analog signal to detect the upper bandwidth limit thereof;
   (b) sampling the analog signal at a variable sampling rate determined in accordance with the determined upper bandwidth limit to derive a sequence of voltage levels; and
   (c) generating a plurality of digital signals representing the sampling rate at which the analog signal was sampled and each voltage level.

2. The method of claim 1, wherein the step (b) includes the step of selecting one of a plurality of sampling rates in dependence upon the upper bandwidth limit.

3. The method of claim 2, wherein the step (b) further includes the step of selecting the lowest sampling rate that exceeds a particular multiple of the upper bandwidth limit.

4. The method of claim 2, wherein the step (b) further includes the step of selecting the lowest sampling rate that exceeds twice the upper bandwidth limit.

5. The method of claim 1, wherein the analog signal comprises an audio signal and wherein the step (b) includes the step of selecting one of fifteen sampling rates in dependence upon the upper bandwidth limit.

6. The method of claim 5, wherein the step (b) further includes the step of selecting the lowest sampling rate that exceeds twice the upper bandwidth limit.

7. The method of claim 1, including the further step of passing the analog signal through a low-pass filter stage before sampling the signal.

8. The method of claim 7, wherein the step of passing includes the step of selecting a cut-off frequency for the low-pass filter that insures that the analog signal to be sampled does not contain components having a frequency greater than a predetermined fraction of the sampling rate.

9. The method of claim 7, wherein the step of passing includes the step of selecting a cut-off frequency for the low-pass filter that insures that the analog signal to be sampled does not contain components at a frequency greater than one-half the sampling rate.

10. The method of claim 1, including the further step of storing the digital signals on a storage medium.

11. The method of claim 1, including the further step of transmitting the digital signals on a transmission medium.

12. The method of claim 1, including the further steps of determining when the analog signal is at substantially a zero level and developing a digital representation of the length of time the analog signal is at substantially the zero level.

13. The method of claim 12, including the further step of storing the digital representation of the length of time the analog signal is at substantially the zero level on the storage medium.

14. The method of claim 12, including the step of storing a signal with the digital representation on the storage medium indicating that the analog signal is at substantially the zero level.

15. Apparatus for encoding input analog signals in digital form, comprising:
   means for detecting the upper bandwidth limit of the input analog signal during each of a plurality of successive sampling intervals;
   means coupled to the detecting means for sampling the input analog signals during each sampling interval at a sampling rate determined in accordance with a detected upper bandwidth limit to derive a series of analog voltage levels of differing time durations which together define a sampled approximation of the input analog signal; and
   means coupled to the sampling means for converting each analog voltage level and the sampling rate at which such voltage level was derived into digital signals to develop a digital representation of the input analog signal.

16. The apparatus of claim 15, wherein the detecting means comprises a real time analyzer.

17. The apparatus of claim 15, further including means coupled to the sampling means and to the detecting means for selecting one of a plurality of sampling rates based upon the detected upper bandwidth limit.

18. The apparatus of claim 17, wherein the converting means comprises an analog-to-digital converter.

19. The apparatus of claim 15, further including a low-pass filter coupled to the sampling means having a variable cut-off frequency determined in accordance with the detected upper bandwidth limit for filtering the input analog signal before it is sampled.

20. The apparatus of claim 15, further including means for determining when the input analog signal is at a substantially zero level and means coupled to the determining means for developing a digital indication of the length of time the input analog signal is at substantially the zero level.

21. The apparatus of claim 20, further including a storage medium for storing the input analog signal in digital form whereby the digital signals from the converting means are stored thereon when the input analog signal is not at substantially the zero level and the digital indication of the length of time is stored thereon when the digital indication is developed.

22. The apparatus of claim 15, further including a storage medium for storing the input analog signal in digital form.

23. The apparatus of claim 22, wherein the input analog signal is an audio signal and wherein the storage medium comprises an audio compact disc.

24. The apparatus of claim 15, in combination with apparatus for decoding the digital representation of the sampled approximation to recreate the audio signals.

25. The apparatus of claim 24, wherein the decoding apparatus includes means responsive to the digital signals for recreating the sampled approximation and means coupled to the recreating means for filtering the recreated sampled approximation to reproduce the analog signals.

26. The apparatus of claim 25, wherein the filtering means comprises a low-pass filter having a variable cut-off frequency determined in accordance with the sampling rate.

27. The apparatus of claim 26, wherein the encoding apparatus further includes means for generating digital indication of when the audio signal is at a substantially zero level and wherein the decoding apparatus includes means responsive to the generating means for inhibiting the output of the decoding apparatus when the digital indication is generated.

28. A method of decoding an analog signal which is digitally encoded with first sets of bits representing the analog signal amplitude, second sets of bits representing the analog signal band width and third sets of bits representing whether the analog signal is substantially at a zero level, comprising the steps of:
converting successive first sets of bits into successive signals, each with an amplitude determined by the first set of bits;
filtering the successive signals by means of a variable cut-off frequency filter;
establishing the cut-off frequency of the filter in accordance with successive second sets of bits; and
inhibiting the output of the filter when the third sets of bits indicate that the analog signal is at substantially the zero level.

29. The method of claim 28, wherein the analog information is additionally encoded in fourth sets of bits representing the duration of time the analog signal is at substantially the zero level and including the further step of retrieving the first through fourth sets of bits from a storage medium.

30. The method of claim 29, wherein the sets of bits are stored as a sequence of data words on the storage medium, each word comprising either a combination of a first set of bits and a second sets of bits or a combination of a third set of bits and a fourth sets of bits and wherein the retrieving step includes the step of individually retrieving the sequence of words.

31. The method of claim 30, wherein the step of individually retrieving includes the step of controlling a latch to sequentially provide the data words to a data switch having a first output coupled to a digital-to-analog (D/A) converter and a second output coupled to a counter.

32. The method of claim 31, including the further step of coupling the latch to a control input of the data switch whereby each data word is sent to the D/A converter or to the counter in dependence upon the state of the signal coupled to the control input.

33. The method of claim 32, wherein the latch includes a control input coupled to the output of an OR gate having inputs coupled to the outputs of the D/A converter and the counter wherein the step of controlling the latch includes the step of causing the counter and the D/A converter to generate an output after the data word is provided thereto so that a high state signal appears at the output of the OR gate to thereby cause the latch to provide the next data word to the data switch.

34. An apparatus for decoding a digital representation of an analog signal stored on a storage medium, such representation comprising a sequence of digital words each of which includes bits representing a level of the analog signal and bits represnting a sampling rate of which the analog signal level was encoded, the analog signal levels together comprising a sampled approximation of the analog signal, comprising:
means for retrieving the digital words from the storage medium;
means coupled to the retrieving means for converting the digital words into the sampled approximation of the analog signal;
a filter coupled to the converting means having a cut-off frequency determined in accordance with the encoded sampling rate for filtering the sampled approximation to reproduce the analog signal; and
and data switch coupled to the retrieving means having a control input which receives the digital words and two outputs, the data switch providing a retrieved digital word at one of the outputs when a control bit of a digital word coupled to the control input is in a first state and providing the retrieved digital word at the other of the outputs when the control bit of the digital word is in a second state, the converting means being coupled to one of the outputs and a programmable counter coupled to the other of the outputs wherein the converting means and the programmable counter include outputs coupled to the retrieving means for causing the retrieving means to retrieve a next digital word after one of the digital words has been retrieved and provided to either the converting means or the programmable counter.

35. The apparatus of claim 34, wherein the first state of the control bit signifies that the analog signal to be reproduced is at a level other than substantially a zero level and wherein the second state of the control bit signifies that the analog signal to be reproduced is at substantially the zero level and further including an OR gate having inputs coupled to the outputs of the converting means and the programmable counter and an output coupled to the control input of the retrieving means for controlling the sequential retrieval of the digital words.

36. The apparatus of claim 35, further including means responsive to the control bit for inhibiting the output of the filter when the control bit is in the second state.

37. A system for encoding an analog input signal in digital form as a series of digital words and for decoding the digital words to reproduce the analog input signal, comprising:
encoding apparatus including
means for detecting the upper bandwidth limit of the analog input signal during successive intervals,
means coupled to the detecting means for sampling the analog input signal during each interval at a sampling rate selected in depedence upon a detected upper bandwidth limit to derive a series of analog voltage levels of varying widths which together define a sample approximation of the analog input signal and
means coupled to the sampling means for converting the analog voltage levels and the sampling rates into the series of digital words; and decoding apparatus coupled to the encoding apparatus including
　means for converting the series of digital words back into the sampled approximation and
　means responsive to the converted sampling rate for filtering the sampled approximation to reproduce the analog input signal.

38. The system of claim 37, further including a storage medium coupled between the encoding apparatus and the decoding apparatus for storing the series of digital words.

39. The system of claim 37, wherein the sampling means samples the analog input signal at a sampling rate selected in dependence upon the upper bandwidth limit in an immediately preceding interval.

40. The system of claim 37, further including a delay line coupled to the input of the sampling means for developing a delayed version of the analog input signal wherein the sampling means samples the delayed version of the analog input signal during intervals thereof at sampling rates detected during corresponding intervals of the analog input signal.

41. The system of claim 37, wherein the encoding apparatus further includes an input low-pass filter for filtering the analog input signal before it is sampled.

42. The system of claim 41, wherein the input low-pass filter has a variable cut-off frequency determined in accordance with the detected upper bandwidth limit.

43. The system of claim 37, wherein the encoding means further includes means for determining when the analog input signal is at substantially a zero level and means for developing a digital word representing the length of time the analog input signal is at substantially the zero level.

44. The system of claim 43, further including a data switch coupled to the converting means and to the developing means, the data switch including a control input responsive to the determining means for passing the output of the converting means to the storage medium when the analog input signal is determined to be at other than the substantially zero level and for passing the output of the developing means plus an additional bit to the storage medium when the digital word representing the length of time the analog input signal is at substantially the zero level is developed.

45. The system of claim 44, wherein the developing means comprises a counter.

46. The system of claim 44, wherein the determining means comprises a silence detector.

47. The system of claim 44, wherein the decoding apparatus includes means responsive to the additional bit for inhibiting the output of the filtering means when the analog input signal to be reproduced is at substantially the zero level.

48. The system of claim 47, wherein the decoding apparatus further includes a latch coupled to the storage medium for sequentially latching the digital words, a second data switch coupled to the latch having a control input responsive to the additional bit and first and second outputs, a digital-to-analog (D/A) converter coupled to the first output and a counter coupled to the second output whereby each digital word is coupled to either the D/A converter or to the counter in dependence upon whether the analog input signal to be reproduced is at substantially the zero level or is not at substantially the zero level.

49. The system of claim 48, wherein the D/A converter includes a first output at which the sampled approximation is developed, the sampled approximation comprising a series of analog levels each of a duration determined by the sampling rate at which the analog level was derived, the D/A converter further including a second output which assumes a high state when each analog level has been maintained at the output of the D/A converter for the determined duration and means for coupling the high state output of the D/A converter to the control input of the latch to cause the latch to latch another digital word.

50. The system of claim 49, wherein the counter comprises a programmable countdown counter which develops a high state output when the digital word received from the second data switch is decremented to zero and wherein the coupling means comprises an OR gate having inputs which receive the high state output from the counter and the high state output of the D/A converter and an output coupled to the latch.

51. The system of claim 37, wherein the detecting means comprises a real time analyzer.

52. The system of claim 51, further including means coupled to the real time analyzer for selecting one of a plurality of sampling rates depending upon the output of the real time analyzer.

53. The system of claim 52, wherein the selecting means comprises a one-of-fifteen selector controlled by a latch.

54. The system of claim 37, wherein the decoding apparatus further includes means for inhibiting the output of the filtering means when the analog input signal to be reproduced is at substantially a zero level.

55. The system of claim 38, wherein the decoding apparatus further includes means for sequentially retrieving the digital words from said storage medium.

56. The system of claim 55, wherein the retrieving means comprises a latch.

57. The system of claim 37, wherein the converting means includes a digital-to-analog (D/A) converter.

58. The system of claim 57, wherein the D/A converter is controlled by a one-of-fifteen selector circuit.

59. The system of claim 58, wherein the filtering means is controlled by the one-of-fifteen selector circuit.

60. The system of claim 58, wherein the one-on-fifteen selector circuit is responsive to the converted sampling rate.

61. A system for encoding an analog input signal in digital form as a series of digital words and for decoding the digital words to reproduce the analog input signal, comprising:
　encoding means including
　　a real time analyzer for detecting the upper bandwidth limit of the input analog signal,
　　a one-of-fifteen selector responsive to the output of the real time analyzer for passing one of fifteen clock signals to an output thereof,
　　an input low-pass filter coupled to the output of the one-of-fifteen selector and to the input analog signal for filtering such signal and having a variable cut-off frequency determined by the output of the one-of-fifteen selector,
　　means for sampling the filtered analog input signal at a sampling rate determined by the output of the one-of-fifteen selector to derive a staircase approximation of the analog input signal, and
　　means for converting the saircase approximation of the analog input signal into a series of digital words; and a decoding apparatus including
  means for sequentially latching the digital words,
    a digital-to-analog (D/A) converter responsive to the sequentially latched words for recreating the staircase approximation of the analog input signal, and
    an output low-pass filter having a variable cut-off frequency determined in accordance with the sampling rate for each portion of the staircase approximation to reproduce the analog input signal.

62. The system of claim 61, wherein the digital words are stored on a storage medium and wherein the encoding apparatus further includes means for detecting when the analog input signal is at substantially a zero level, a counter responsive to the detecting means for developing a digital indication of the length of time the analog input signal is at substantially the zero level and a data switch coupled to the output of the counter and to the output of the A/D converter for passing the output of the counter to the storage medium when the digital indication is developed and for passing the output of the A/D converter to the storage medium when the analog input signal is not at substantially the zero level.

63. The system of claim 62, wherein the decoding means further includes a data switch coupled to the output of the latch having a first output coupled to the D/A converter and a second output coupled to the input of a programmable countdown timer for providing the digital words to the D/A converter or to the counter in dependence upon whether the analog input signal to be reproduced is not a substantially the zero level or is at substantially the zero level, respectively.

64. The system of claim 63, wherein the decoding means further includes an OR gate coupled to the outputs of the counter and the D/A converter for controlling the latching of the digital words by the latch.

65. A method of encoding an analog signal as a series of digital signals, comprising the steps of:
  generating a digital duration signal representing the period of time during which the analog signal is at substantially a zero level;
  generating a digital silence signal when the analog signal is at substantially a zero level;
  converting the portions of the analog signal which are at levels other than substantially the zero level into a series of digital words including the steps of detecting the upper bandwidth limit of the analog signal and sampling the analog signal at a variable sampling rate determined in accordance with the detected upper bandwidth limit to derive a sampled approximation of the analog signal; and
  combining the digital silence signal with the digital duration signal and the series of digital words to derive the series of digital signals.

66. The method of claim 65, wherein the step of converting includes the further steps of generating a digital representation of the sampling rate, passing the sampled approximation through an analog-to-digital converter to derive a digital representation of such sampled aproximation and combining such digital representations.

67. The method of claim 65, wherein the step of sampling includes the step of choosing one of a plurality of sampling rates in dependence upon the detected upper bandwidth limit.

68. The method of claim 67, wherein the step of choosing includes the step of controlling a one-of-fifteen selector whereby one of fifteen sampling rates is chosen.

69. A method of encoding an analog signal as a series of digital signals, comprising the steps of:
  generating a digital silence signal when the analog signal is at substantially a zero level;
  enabling a counter while the silence signal is generated to derive a first set of digital words representing the length of time the analog signal is at substantially the zero level;
  converting the remaining portions of the analog signal not at substantially the zero level into a second set of digital words including the steps of detecting the upper bandwidth limit of the analog signal and sampling the remaining portions at a variable sampling rate selected in accordance with the detected upper bandwidth limit to derive a sampled approximation of the analog signal; and
  combining the first and second sets of digital words with the digital silence signal to derive the digital signals.

70. The method of claim 69, wherein the step of converting includes the further step of passing the sampled approximation through an analog-to-digital converter to derive a digital representation of the sampled approximation.

71. The method of claim 69, wherein the step of sampling includes the step of choosing one of a plurality of sampling rates in dependence upon the detected upper bandwidth limit.

72. The method of claim 71, wherein the step of choosing includes the step of controlling a one-of-fifteen selector whereby one of fifteen sampling rates is chosen.

73. An apparatus for encoding input analog signals in digital form, comprising:
  means for detecting the upper bandwidth limit of the input analog signal during each of a plurality of successive sampling intervals;
  means coupled to the detecting means for sampling the input analog signals during each sampling interval at a sampling rate determined in accordance with the detected upper bandwidth limit for that interval to derive a series of voltage levels which together define a sampled approximation of the input analog signal; and
  means coupled to the sampling means for converting each voltage level and the sampling rate at which such voltage level was derived into digital signals to develop a digital representation of the input analog signal.

74. The apparatus of claim 73, further including a delay line coupled to the sampling means for delaying the input analog signals before sampling.

75. The apparatus of claim 74, wherein the sampling means samples the input analog signals at one of a plurality of sampling rates and wherein the delay line provides a delay greater than one period of the lowest sampling rate.

76. A method of decoding a digital representation of an analog signal, the digital representation including a first set of digital signals each representing the level of a sample of the analog signal, a second set of digital signals each representing the duration of a sample, a third set of digital signals indicating when the analog signal is at substantially a zero level and a fourth set of digital signals indicating the duration of time such signal is at the substantially zero level, comprising the steps of:

generating a multi-level signal having levels determined by the first set of digital signals and durations determined by the second set of digital signals;

filtering the multi-level signal by means of a low-pass filter;

selecting the cut-off frequency of the low pass filter in dependence upon the second set of digital signals to derive the analog signal; and inhibiting the output of the low pass fiter when the third and fourth signals indicate that the analog signal is at a substantially zero level to reproduce the substantially zero levels during such time.

77. An apparatus for decoding a digital representation of an analog signal stored on a storage medium, such representation comprising a sequence of digital words each of which includes bits representing a level of the analog signal and bits representing a sampling rate at which the analog signal level was encoded, the analog signal levels together comprising a sampled approximation of the analog signal, comprising:

means for sequentially retrieving the digital words from the storage medium;

means coupled to the retrieving means for converting the digital words into the sampled approximation of the analog signal;

a filter coupled to the converting means having a cutoff frequency determined in accordance with the encoded sampling rate for filtering the sampled approximation to reproduce the analog signal; and means for inhibiting the output of the filter when the analog signal to be reproduced is at substantially a zero level.

* * * * *